(12) United States Patent
Kim

(10) Patent No.: US 9,490,307 B2
(45) Date of Patent: Nov. 8, 2016

(54) ORGANIC LIGHT-EMITTING DIODE (OLED) DISPLAY

(71) Applicant: Samsung Display Co., Ltd., Yongin, Gyeonggi-Do (KR)

(72) Inventor: Tae Sik Kim, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 228 days.

(21) Appl. No.: 14/498,738

(22) Filed: Sep. 26, 2014

(65) Prior Publication Data
US 2015/0187845 A1 Jul. 2, 2015

(30) Foreign Application Priority Data

Dec. 31, 2013 (KR) .................. 10-2013-0169359

(51) Int. Cl.
*H05B 33/04* (2006.01)
*H01L 27/32* (2006.01)

(52) U.S. Cl.
CPC ......... *H01L 27/323* (2013.01); *H01L 27/3272* (2013.01)

(58) Field of Classification Search
CPC ........................ H01L 27/323; H01L 27/3272
USPC ........................................................ 313/504
See application file for complete search history.

(56) References Cited

U.S. PATENT DOCUMENTS

| | | | |
|---|---|---|---|
| 4,049,893 A | 9/1977 | Kidwell, Jr. | |
| 6,847,415 B1 * | 1/2005 | Yoshimura | G02F 1/13452 349/149 |
| 9,129,916 B2 * | 9/2015 | Kim | H01L 27/323 |
| 2009/0207560 A1 * | 8/2009 | Lee | H01L 51/5243 361/679.01 |
| 2015/0162388 A1 * | 6/2015 | Kim | H01L 27/323 257/40 |

FOREIGN PATENT DOCUMENTS

| | | |
|---|---|---|
| JP | 2012-104714 A | 5/2012 |
| KR | 10-0476533 B1 | 3/2005 |
| KR | 10-0837658 B1 | 6/2008 |
| KR | 10-0841042 B1 | 6/2008 |
| KR | 10-0936535 B1 | 1/2010 |
| KR | 10-0992458 B1 | 11/2010 |

* cited by examiner

*Primary Examiner* — Nimeshkumar Patel
*Assistant Examiner* — Christopher Raabe
(74) *Attorney, Agent, or Firm* — Knobbe, Martens, Olson & Bear, LLP

(57) ABSTRACT

An organic light-emitting diode (OLED) display is disclosed. In one aspect, the OLED display includes a display substrate including first and second surfaces opposing each other. The OLED display further includes a touch sensing layer formed over the encapsulation substrate and configured to sense a touch input, a display flexible printed circuit board electrically attached to the second surface of the display substrate, and a touch flexible printed circuit board electrically connected to the touch sensing layer and attached to the second surface of the display substrate. An impact absorbing layer is formed over the second surface of the display substrate and attaches the display flexible printed circuit board and the touch flexible printed circuit board to the second surface of the display substrate. The impact absorbing layer includes a metal layer electrically connected to the display flexible printed circuit board and the touch flexible printed circuit board.

20 Claims, 12 Drawing Sheets

ORGANIC LIGHT-EMITTING DIODE (OLED) DISPLAY

CROSS-REFERENCE TO RELATED APPLICATIONS

This application claims priority to and the benefit of Korean Patent Application No. 10-2013-0169359 filed in the Korean Intellectual Property Office on Dec. 31, 2013, the entire contents of which are incorporated herein by reference.

BACKGROUND

1. Field

The described technology generally relates to an organic light-emitting diode (OLED) display, and more particularly, to an OLED display including a touch sensing layer.

2. Description of the Related Technology

Flat panel displays, such as organic light-emitting diode (OLED) displays, liquid crystal displays (LCDs), and electrophoretic display (EPDs), include a field generating electrode and an electro-optical active layer. For example, OLED displays include an organic emission layer as the electro-optical active layer and EPDs include charged particles. The field generating electrode is connected to a switching element such as a thin film transistor (TFT) to receive a data signal and the electro-optical active layer converts the data signal to an optical signal to display an image.

Recently, many such displays have included a touch sensing function in which interaction with a user can be performed, in addition to the base functionality of displaying images. The touch sensing function is used to generate touch information such as whether an object touches a screen and the touch location thereof by sensing a change in pressure, charge, light, or the like applied to the screen of the display when a user touches a finger or a touch pen to the screen. The display can receive new image signals based on the touch information. In addition, an impact absorbing layer can be attached to the display device to absorb external impacts.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is an organic light-emitting diode (OLED) display including a touch sensing layer and having the advantage of shielding an impact absorbing layer from electro-magnetic interference.

Another aspect is an OLED display including a display substrate having first and second surfaces opposing each other, a thin film display layer formed over the first surface of the display substrate, an encapsulation substrate formed over the thin film display layer, a touch sensing layer formed over the encapsulation substrate and configured to sense a touch input, a display flexible printed circuit board electrically connected to the thin film display layer and attached to at least the second surface of the display substrate, a touch flexible printed circuit board electrically connected to the touch sensing layer and attached to the second surface of the display substrate, and an impact absorbing layer formed over the second surface of the display substrate and attaching the display flexible printed circuit board and the touch flexible printed circuit board to the second surface of the display substrate, wherein the impact absorbing layer includes a metal layer electrically connected to the display flexible printed circuit board and the touch flexible printed circuit board.

The impact absorbing layer may further include a first adhesive layer formed over the second surface the display substrate and a cushion layer configured to absorb external impacts.

The first adhesive layer may be formed between the display substrate and the metal layer and the metal layer may be formed between the first adhesive layer and the cushion layer.

The impact absorbing layer may further include a first opening partially exposing the display flexible printed circuit board and the touch flexible printed circuit board.

The first opening may be formed in the metal layer and the cushion layer.

The impact absorbing layer may further include a second opening exposing the display flexible printed circuit board and the touch flexible printed circuit board.

The second opening may be formed in the first adhesive layer.

The area of the first opening may be less than the area of the second opening.

The impact absorbing layer may further include an overlapped portion that at least partially overlaps the display flexible printed circuit board and the touch flexible printed circuit board.

The metal layer and the cushion layer may be formed on the display flexible printed circuit board and the touch flexible printed circuit board in the overlapped portion.

The metal layer may be electrically connected to the display flexible printed circuit board and the touch flexible printed circuit board in the overlapped portion.

The display flexible printed circuit board and the touch flexible printed circuit board may be bent around an edge of the display substrate.

The display flexible printed circuit board and the touch flexible printed circuit board may be electrically connected to each other.

The thin film display layer may include a plurality of pixels and each pixel may include an OLED.

The OLED display may further include a display driver formed on the first surface of the display substrate and configured to apply a driving signal to each pixel and a touch driver formed on the touch flexible printed circuit board and configured to receive a sense output signal from the touch sensing layer.

Another aspect is an OLED display including a display substrate having first and second surfaces opposing each other, a thin film display layer formed over the first surface of the display substrate, an encapsulation substrate formed over the thin film display layer, a touch sensing layer formed over the encapsulation substrate and configured to sense a touch input, a display flexible printed circuit board electrically connected to the thin film display layer and attached to at least the second surface of the display substrate, a touch flexible printed circuit board electrically connected to the touch sensing layer and attached to the second surface of the display substrate, and an impact absorbing layer formed over the second surface of the display substrate and attaching the display flexible printed circuit board and the touch flexible printed circuit board to the second surface of the display substrate, wherein the impact absorbing layer includes a metal layer electrically connected to the display flexible printed circuit board and the touch flexible printed circuit board.

The impact absorbing layer can further include a first adhesive layer formed over the second surface of the display substrate and a cushion layer configured to absorb external impacts. The first adhesive layer can be interposed between the display substrate and the metal layer and the metal layer can be interposed between the first adhesive layer and the cushion layer. A first opening can be formed in the impact absorbing layer and at least partially expose the display flexible printed circuit board and the touch flexible printed circuit board. The first opening can be formed in the metal layer and the cushion layer. A second opening can be further formed in the impact absorbing layer and expose the display flexible printed circuit board and the touch flexible printed circuit board. The second opening can be formed in the first adhesive layer. The area of the first opening can be less than the area of the second opening. The impact absorbing layer can further include an overlapped portion that at least partially overlaps the display flexible printed circuit board and the touch flexible printed circuit board.

The metal layer and the cushion layer can be formed on the display flexible printed circuit board and the touch flexible printed circuit board in the overlapped portion. The metal layer can be formed at least in the overlapped portion. The display flexible printed circuit board and the touch flexible printed circuit board can be bent around an edge of the display substrate. The display flexible printed circuit board and the touch flexible printed circuit board can be electrically connected to each other. The thin film display layer can including a plurality of pixels and wherein each pixel can include an OLED. The OLED display can further include a display driver formed on the first surface of the display substrate and configured to apply a driving signal to each pixel and a touch driver formed on the touch flexible printed circuit board and configured to receive a sense output signal from the touch sensing layer. The touch flexible printed circuit board can at least partially overlap the display flexible printed circuit board, wherein each of the display flexible printed circuit board and the touch flexible printed circuit board surrounds at least three surfaces of the display substrate, and wherein the display flexible printed circuit board is attached to the first surface of the display substrate.

Another aspect is an OLED display including a display substrate including first and second surfaces opposing each other, a display flexible printed circuit board attached to at least the second surface of the display substrate, a touch flexible printed circuit board attached to the second surface of the display substrate and at least partially overlapping the display flexible printed circuit board, wherein each of the display flexible printed circuit board and the touch flexible printed circuit board surrounds at least three surfaces of the display substrate, and an impact absorbing layer formed over the second surface of the display substrate and at least a portion of the display flexible printed circuit board and the touch flexible printed circuit board, wherein the impact absorbing layer include a metal layer electrically connected to the display flexible printed circuit board and the touch flexible printed circuit board.

Each of the display flexible printed circuit board and the touch flexible printed circuit board can include a grounding wire electrically connected to the metal layer. The impact absorbing layer can further include a first adhesive layer interposed between the metal layer and the second surface of the display substrate and a cushion layer formed over the metal layer and configured to absorb external impacts. A first opening can be formed in the metal layer and cushion layer and wherein a second opening having a greater area than the first opening is formed in the first adhesive layer. The OLED display can further include touch sensing layer configured to sense a touch input, wherein the display flexible printed circuit board is attached to the first surface of the display substrate, and wherein the touch flexible printed circuit board is attached to the touch sensing layer.

As described, according to at least one embodiment, the impact absorbing layer includes the metal layer that is electrically connected with a ground line of the display flexible printed circuit board and the touch flexible printed circuit board, thereby shielding electro-magnetic interference.

In addition, since the impact absorbing layer partially overlaps the display flexible printed circuit board and the touch flexible printed circuit board, the display flexible printed circuit board and the touch flexible printed circuit board are fixed, and accordingly the display flexible printed circuit board and the touch flexible printed circuit board can be substantially prevented from being lifted.

DETAILED DESCRIPTION OF CERTAIN INVENTIVE EMBODIMENTS

Figure 1:
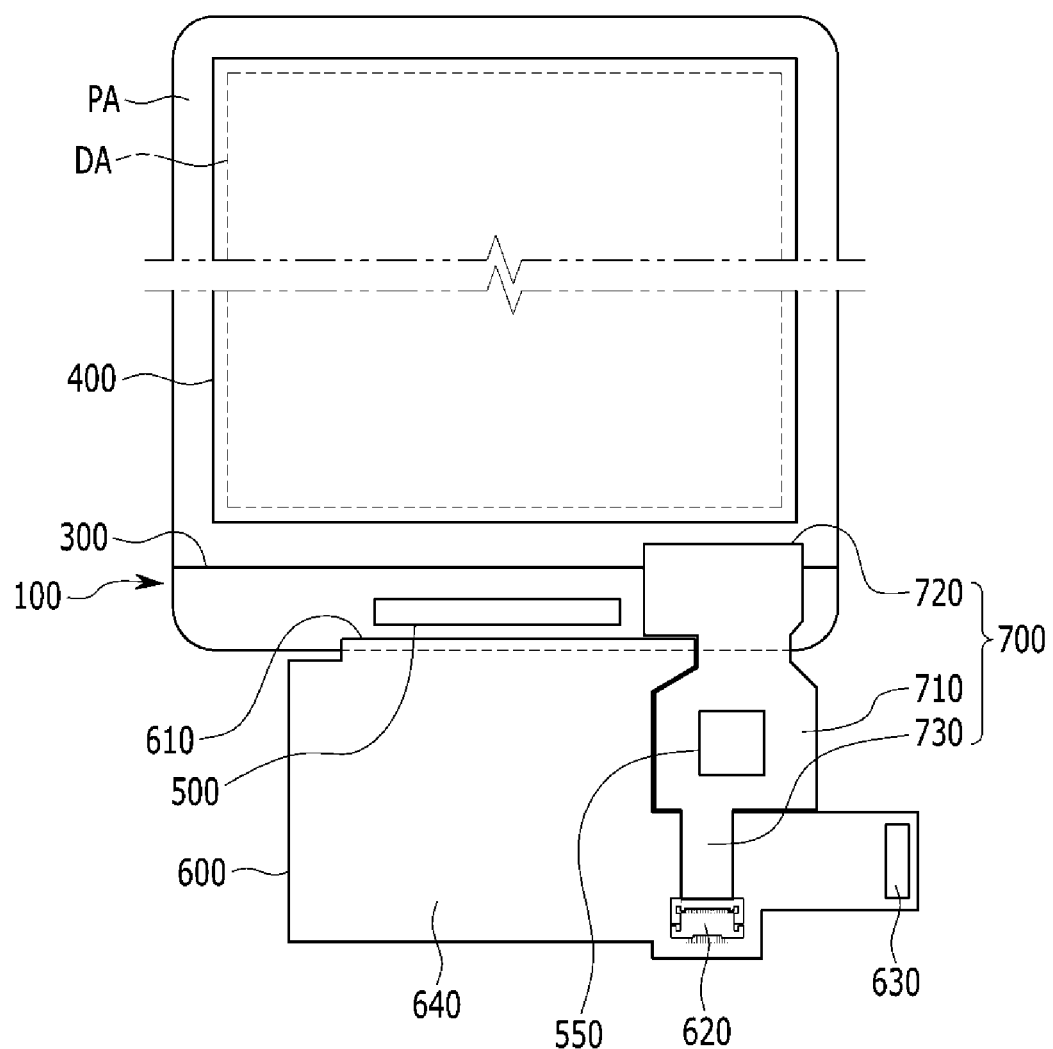
FIG. 1 is a top plan view of the structure of an OLED display before a flexible printed circuit board is bent according to an exemplary embodiment.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology. On the contrary, exemplary embodiments introduced herein are provided to make disclosed contents thorough and complete, and sufficiently transfer the spirit of the described technology to those skilled in the art.

In the drawings, the thicknesses of layers, films, panels, regions, etc., may be exaggerated for the sake of clarity. It will be understood that when a layer is referred to as being "on" another layer or substrate, it can be directly on the other layer or substrate or intervening elements may also be present. Like reference numerals designate like elements throughout the specification. The term "substantially" as used in this disclosure means completely, almost completely, or to any significant degree.

An organic light-emitting diode (OLED) display according to an exemplary embodiment will be described with reference to FIG. 1 to FIG. 13.

Figure 2:
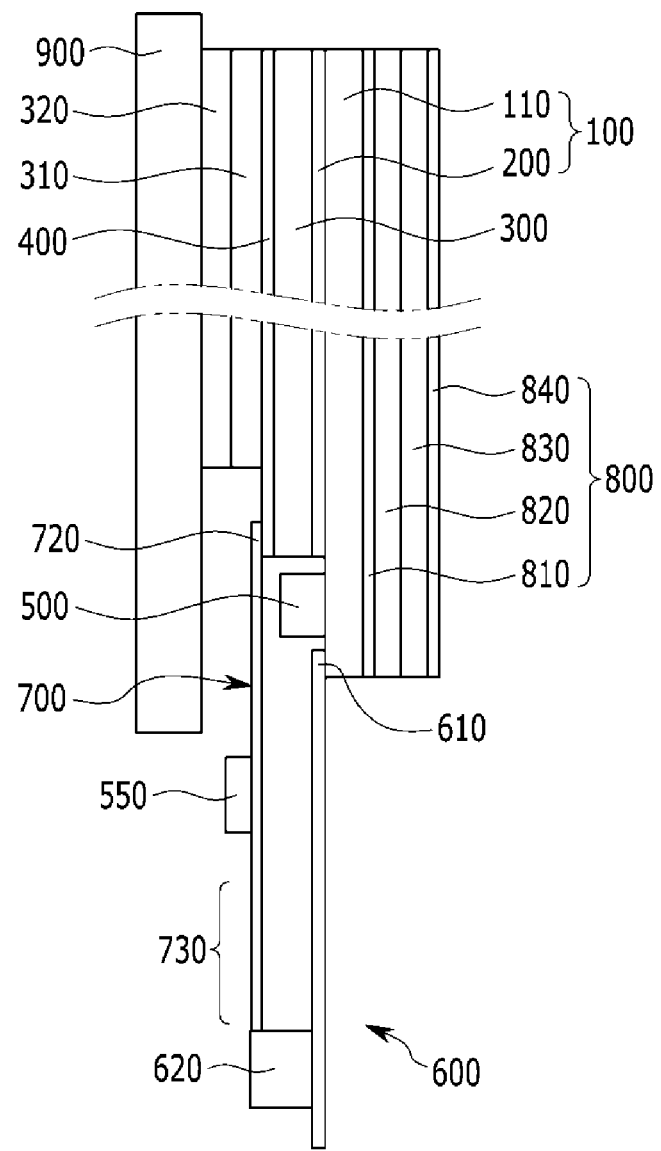
FIG. 2 schematically shows the side surface of the OLED display of FIG. 1.

FIG. 1 and FIG. 2 show the structure of an OLED display before a flexible printed circuit board is bent and attached to the rear surface of a lower substrate.

The OLED display includes a display panel 100, an encapsulation substrate 300, a touch sensing layer 400, a polarization layer 310, a resin layer 320, and a window 900. In addition, the OLED display includes an impact absorbing layer 800. In FIG. 1, the polarization layer 310, the resin layer 320, and the window 900 are omitted for convenience of illustration of a plane view of the OLED display.

In addition, the OLED display includes a display flexible printed circuit board 600 attached to the display panel 100 and a touch flexible printed circuit board 700 attached to the encapsulation substrate 300.

As shown in the plane view of FIG. 1, the OLED display includes a display area DA where an image is displayed and a peripheral area PA surrounding the display area DA.

The display panel 100 includes a display substrate 110 formed of an insulating material such as transparent glass or plastic and a thin film display layer 200 formed on a first side or first surface of the display substrate 110.

The display substrate 110 can have rounded corners to prevent breakage.

The thin film display layer 200 includes a plurality of pixels and each pixel includes a switching thin film transistor Qs, a driving thin film transistor Qd, a storage capacitor Cst, and an OLED LD.

The display panel 100 includes a display driver 500 for applying a driving signal to each pixel of the thin film display layer 200. The display driver 500 is formed in the peripheral area PA on the display substrate 110.

The encapsulation substrate 300 is formed facing the thin film display layer 200, functions as an encapsulation substrate, and is bonded to the display substrate 110 via a sealant (not shown).

The touch sensing layer 400 is formed on the outer side of the encapsulation substrate 300, that is, the side of the encapsulation substrate 300 opposing the thin film display layer 200. The touch sensing layer 400 senses touch input. The touch sensing layer 400 can sense touch input when an object approaches or touches the touch sensing layer 400 or the window 900. Here, touch input refers not only to when an external object such as a user's finger directly touches the touch sensing layer 400 or the window 900, but also when the external object approaches or hovers over the touch sensing layer 400 or window 900.

The polarization layer 310, the resin layer 320, and the window 900 are sequentially formed on the touch sensing layer 400.

The polarization layer 310 increases the contrast ratio by reducing reflection of external light and the resin layer 320 is an adhesive layer for attaching the window 900 to the OLED display. The window 900 protects the display panel 100 and the touch sensing layer 400.

The display flexible printed circuit board 600 includes a display terminal 610, a connection portion 620, an input portion 630, and a display main body 640.

The display terminal 610 is attached to the display substrate 110 and thus connects the flexible printed circuit board 600 to the display driver 500, the connection portion 620 connects the touch flexible printed circuit board 700 to the display flexible printed circuit board 600, and the input portion 630 receives an input signal from an external source. Various circuit elements can be formed on the display main body 640.

The display flexible printed circuit board 600 receives an input signal through the input portion 630 and applies the received signal to the display driver 500.

The touch flexible printed circuit board 700 includes a touch main body 710, a touch terminal 720, and a tail portion 730.

The touch terminal 720 is attached to the encapsulation substrate 300 and connects the touch flexible printed circuit board 700 to the touch sensing layer 400. The tail portion 730 extends from an end of the main body 710 and is connected to the connection portion 620. Accordingly, the touch flexible printed circuit board 700 is connected to the flexible printed circuit board 600 and receives an input signal through the input portion 630.

A touch driver 550 is mounted to the touch main body 710. The touch driver 550 receives a sense input signal of the touch sensing layer 400 from the external source outside and transmits the received signal to the touch sensing layer 400. In addition, the touch driver 550 receives a sense output signal from the touch sensing layer 400 and process the received signal.

The impact absorbing layer 800 is formed on the second side or second surface of the display substrate 110, that is, the impact absorbing layer 800 is formed on a surface of the display substrate 110 opposing the thin film display layer 200.

The impact absorbing layer 800 absorbs external impacts and substantially prevents the display panel 100, the encapsulation substrate 300, and the touch sensing layer 400 from being damaged due to the impacts. The impact absorbing layer 800 also attaches the display panel 100 to other parts, for example, a case or the like. The impact absorbing layer 800 includes a first adhesive layer 810, a metal layer 820, a cushion layer 830, and a second adhesive layer 840 sequentially formed in the described order on the second side of the display substrate 100.

The first adhesive layer 810 is attached to the second side of the display substrate 110 and attaches the impact absorbing layer 800 to the second side of the display substrate 110.

The metal layer 820 is electrically connected to a grounding wire of the display flexible printed circuit board 600 and the touch flexible printed circuit board 700 to shield the OLED display from electromagnetic interference (EMI). In addition, since the metal layer 820 has high heat conductivity, the metal layer 820 enhances heat dissipation by dispersing heat generated by the OLED display.

The cushion layer 830 can prevent the display panel 100, the encapsulation substrate 300, and the touch sensing layer 400 from being damaged by absorbing external impacts.

The second adhesive layer 840 is attached to other parts, for example a case or the like, and thus attaches the impact absorbing layer 800 to the other parts.

Figure 3:
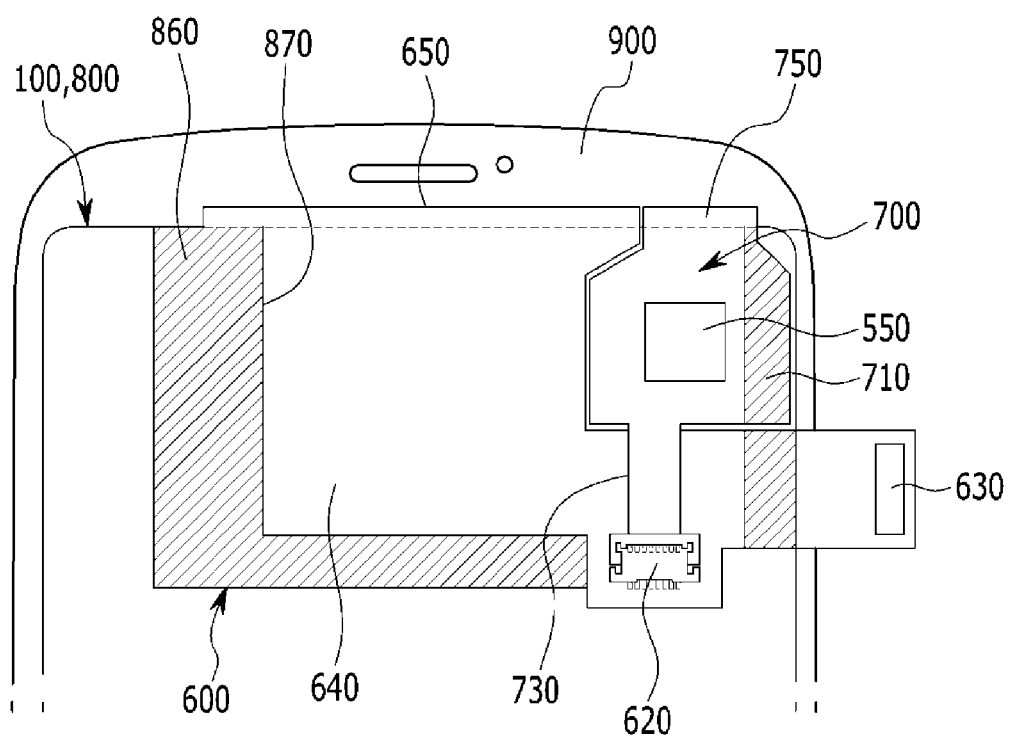
FIG. 3 is a top plan view in which the flexible printed circuit board is bent and attached to the other surface of a display substrate in the OLED display of FIG. 1.
Figure 4:
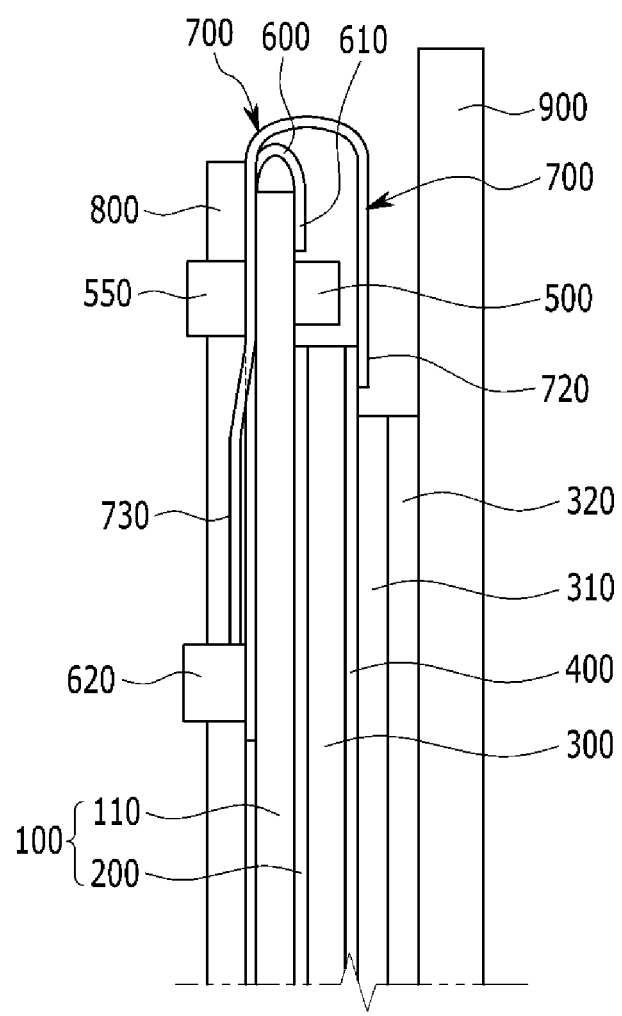
FIG. 4 is a side view schematically illustrating the side surface of the OLED display of FIG. 3.

As shown in FIG. 3 and FIG. 4, in order to apply the OLED display to an actual product, the flexible printed circuit board 600 and the touch flexible printed circuit board 700 are bent around an edge of the display substrate 110 and are thus attached to the lower display substrate 110.

Referring to FIG. 3 and FIG. 4, the bending portion 650 of the flexible printed circuit board 600 is bent and surrounds a portion of the edge of the display substrate 110. The display element 610 of the flexible printed circuit board 600 is attached to the first side of the display substrate 110 and the display main body 640 of the flexible printed circuit board 600 is attached to the second side of the display substrate 110.

A bending portion 750 of the touch flexible printed circuit board 700 is bent around the edge of the encapsulation substrate 300. The touch terminal 720 of the touch flexible printed circuit board 700 is attached to the first side of the display substrate 110 and a corner of the display substrate 110 is not surrounded by the bending portion 650 of the flexible printed circuit board 600. The touch main body 710 of the touch flexible printed circuit board 700 is also attached to the second side of the display substrate 110. As shown in FIG. 3, the bending portion 750 and the touch main body 710 of the touch flexible printed circuit board 700 do not overlap the flexible printed circuit board 600 and the tail portion 730 overlaps the flexible printed circuit board 600.

The impact absorbing layer 800 includes a first opening 870 partially exposing the flexible printed circuit board 600 and the touching printed circuit board 700 attached to the second side of the display substrate 110. The first opening 870 exposes the touch driver 550 and the connection portion 620.

In addition, the impact absorbing layer 800 includes an overlapped portion 860 that partially overlaps the display flexible printed circuit board 600 and the touch flexible printed circuit board 700. The impact absorbing layer 800 attached to the second side of the display substrate 110 attaches the displaying printed circuit board 600 and the touch flexible printed circuit board 700 to the second side of the display substrate 110 through the overlapped portion 860. In the overlapped portion 860, the impact absorbing layer 800 is formed above the display flexible printed circuit board 600 and the touch flexible printed circuit board 700.

That is, since the display flexible printed circuit board 600 and the touch flexible printed circuit board 700 are interposed between the display substrate 110 and the impact absorbing layer 800 in the overlapped portion 860, the display flexible printed circuit board 600 and the touch flexible printed circuit board 700 can be substantially prevented from being lifted from the second side of the display substrate 110.

Now, the impact absorbing layer according to an exemplary embodiment will be described with reference to FIG. 5 to FIG. 7.

Figure 5:
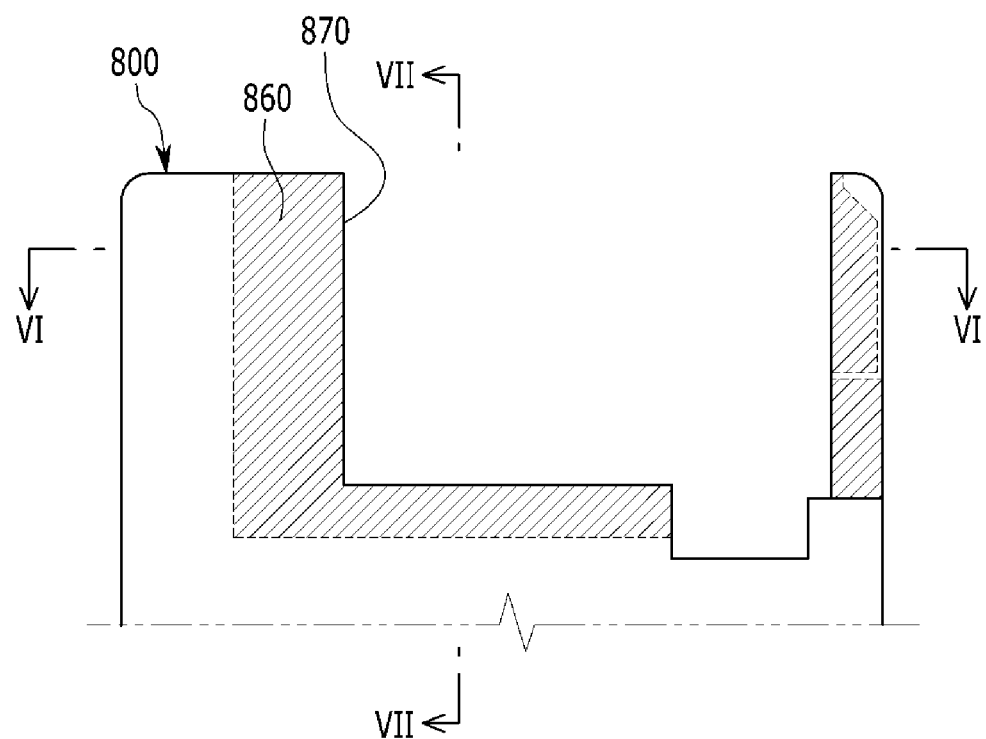
FIG. 5 is a top plan view of an impact absorbing layer according to an exemplary embodiment.
Figure 6:
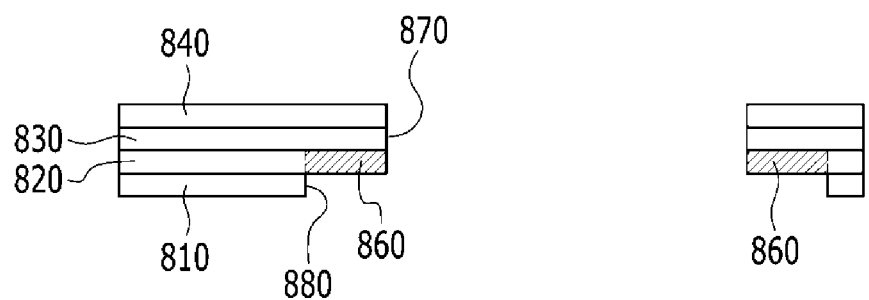
FIG. 6 is a cross-sectional view of FIG. 5, taken along the line VI-VI.
Figure 7:
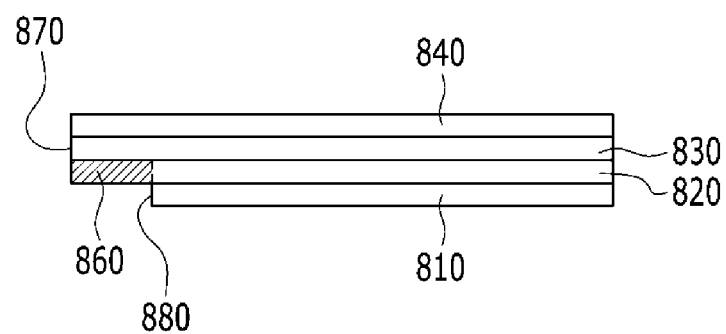
FIG. 7 is a cross-sectional view of FIG. 5, taken along the line VII-VII.

Referring to FIG. 5 to FIG. 7, the impact absorbing layer 800 includes the overlapped portion 860, the first opening 870, and a second opening 880.

As previously described, the overlapped portion 860 partially overlaps the display flexible printed circuit board 600 and the touch flexible printed circuit board 700 and the first opening 870 partially overlaps the flexible printed circuit board 600 and the touch flexible printed circuit board 700.

The first opening 870 is formed in the metal layer 820, the cushion layer 830, and the second adhesive layer 840.

The second opening 880 is formed in the first adhesive layer 810. The second opening 880 exposes the display flexible printed circuit board 600 and the touch flexible printed circuit board 700 and the area of the second opening 880 is greater than that of the first opening 870. Accordingly, the overlapped portion 860 is located in the metal layer 820, the cushion layer 830, and the second adhesive layer 840.

In the overlapped portion 860, the metal layer 820, the cushion layer 830, and the second adhesive layer 840 are formed over the display flexible printed circuit board 600 and the touch flexible printed circuit board 700. Thus, the metal layer 820 partially overlaps the display flexible printed circuit board 600 and the touch flexible printed circuit board 700 and is electrically connected thereto in the overlapped portion 860. In addition, since the metal layer 820, the cushion layer 830, and the second adhesive layer 840 fixes the display flexible printed circuit board 600 and the touch flexible printed circuit board 700 in the overlapped portion 860, the display flexible printed circuit board 600 and the touch flexible printed circuit board 700 can be substantially prevented from being lifted from the second side of the display substrate 110.

Next, the touch sensing layer according to an exemplary embodiment will be described in detail with reference to FIG. 8 to FIG. 10.

Figure 8:
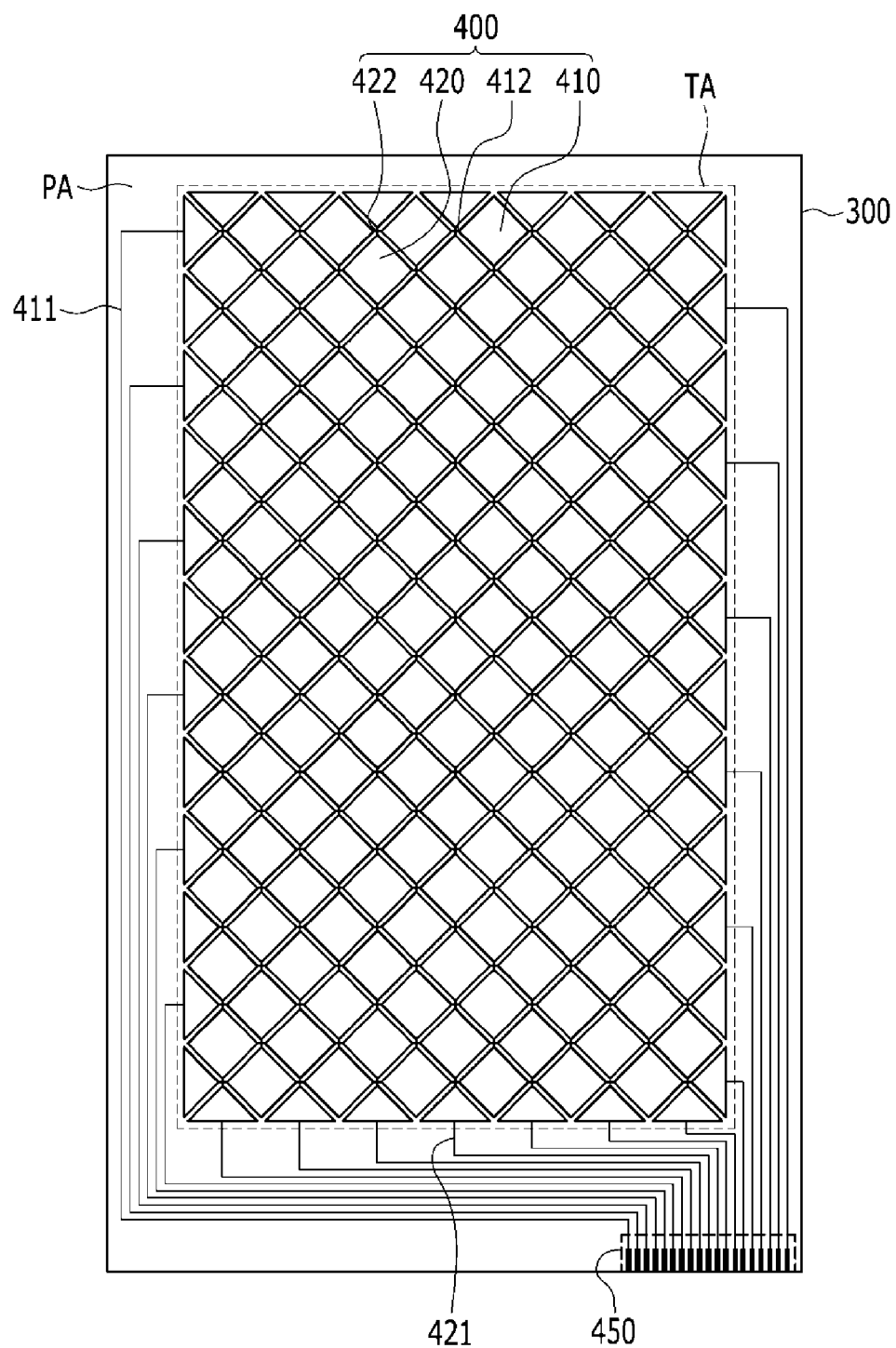
FIG. 8 is a top plan view of a touch sensing layer of the OLED display of FIG. 1.

Referring to FIG. 8, the touch sensing layer 400 is formed on the encapsulation substrate 300. The touch sensing layer 400 is formed in a touch active area TA where touch input can be sensed. The touch active area TA may be the entire display area DA or may include a part of the peripheral area PA. Alternatively, only a part of the display area DA may be the touch active area TA.

The touch sensing layer 400 can sense contact with various methods. For example, contact sensing can be classified into various methods such as resistive, capacitive, electro-magnetic (EM), and optical contact sensing.

Figure 9:
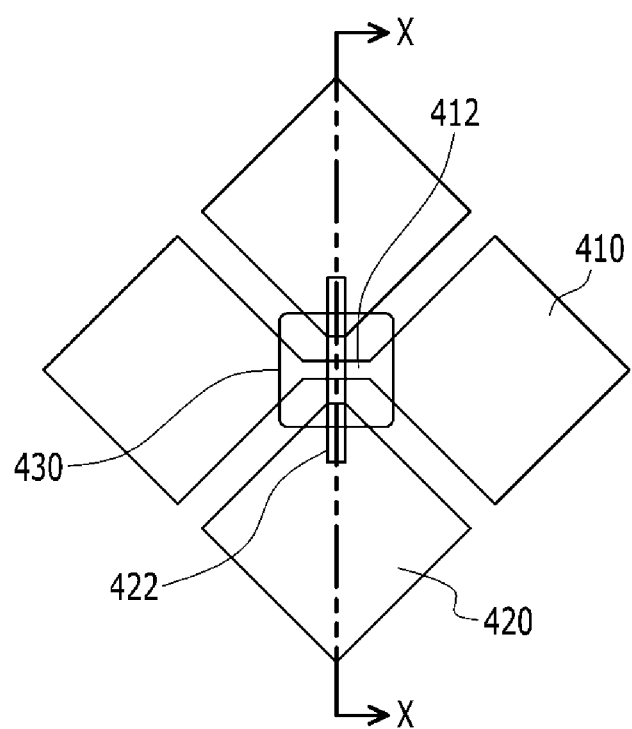
FIG. 9 is an enlarged view of a part of the touch sensing layer of FIG. 8.
Figure 10:
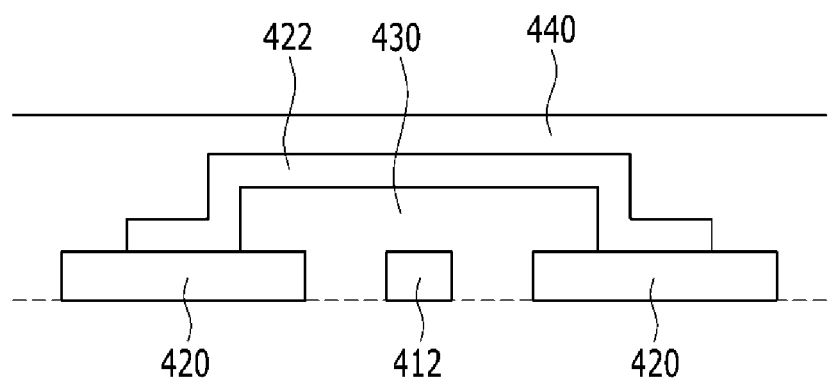
FIG. 10 is a cross-sectional view of FIG. 9, taken along the line X-X.

In the embodiment of FIGS. 8-10, capacitive contact sensing will be exemplarily described.

The touch sensing layer 400 includes a plurality of touch electrodes and the touch electrodes include a plurality of first touch electrodes 410 and a plurality of second touch electrodes 420. The first and second touch electrodes 410 and 420 are separated from each other.

The first and second touch electrodes 410 and 420 are alternately distributed so as to not overlap each other in the touch active area TA. The first touch electrodes 410 may be formed in a column direction and a row direction and the second touch electrodes 420 may also be formed in a column direction and a row direction.

The first and second touch electrodes 410 and 420 the second touch electrodes 420 are formed on the same layer as each other or on different layers from each other, but this is not restrictive. In some embodiments, the first and second touch electrodes 410 and 420 are positioned in different layers. In the FIG. 8 embodiment, each of the first and second touch electrodes 410 and 420 the second touch electrodes 420 forms a quadrangle, but they are not limited thereto, and may have various forms such as protrusions for improving the sensitivity of the touch sensor.

At least some of the first touch electrodes 410 arranged in the same row or column are electrically connected to each other or separated from each other either inside or outside the touch active area TA. Likewise, at least some of the second touch electrodes 420 arranged in the same column or row are electrically connected to each other or separated from each other either inside or outside the touch active area TA. For example, as illustrated in FIG. 8, the first touch electrodes 410 formed in the same row are electrically connected to each other inside the touch active area TA and the second touch electrodes 420 formed in the same column are electrically connected to each other inside the touch active area TA. In more detail, the first touch electrodes 410 positioned in each row are electrically connected to each other through first connection portions 412 and the second touch electrodes 420 positioned in each column are electrically connected to each other through second connection portions 422.

The first touch electrodes 410 connected to each other in each row are electrically connected to the touch driver 550 through first touch wires 411 and the second touch electrodes 420 connected to each other in each column are electrically connected to the touch driver 550 through second touch wires 421. The first and second touch wires 411 and 421 are formed in the peripheral area PA in the embodiment of FIG. 8, but in other embodiments are formed in the touch active area TA. End portions of the first and second touch wires 411 and 421 form a pad portion 450 in the peripheral area PA of the encapsulation substrate 300.

Referring to FIG. 9 and FIG. 10, the first connection portions 412 connecting the first touch electrodes 410 adjacent to each other are formed on the same layer as the first touch electrodes 410 and can be formed of the same material as the first touch electrodes 410. That is, the first touch electrodes 410 and the first connection portions 412 are integrated and simultaneously patterned in the embodiment of FIGS. 9 and 10.

The second connection portions 422 connecting the second touch electrodes 420 adjacent to each other are formed on a different layer from the second touch electrodes 420. That is, the second touch electrodes 420 and the second connection portions 422 are separated from each other and separately patterned. The second touch electrodes 420 and the second connection portions 422 are electrically connected to each other through direct contact.

A first insulating layer 430 is formed between the first and second connection portions 412 and 422 electrically insulate them from each other. The first insulating layer 430 is formed as a plurality of independent island-shaped insulators for every intersection between the first and second connection portions 412 and 422. The first insulating layer 430 exposes at least a portion of the second touch electrodes 420 so that the second connection portions 422 are electrically connected to the second touch electrodes 420. The first insulating layer 430 has rounded corners and may be formed of SiOx, SiNx, and/or SiOxNy. According to other embodiments, the first insulating layer is formed over the entirety of the first and second touch electrodes 410 and 420.

A second insulating layer 440 is formed on the first and second touch electrodes 410 and 420 and the second connection portions 422. The second insulating layer 440 is formed throughout the entirety of touch active area TA and may be formed of SiOx, SiNx, and/or SiOxNy.

In other embodiments and in contrast to the embodiment of FIGS. 8-10, the second connection portions 422 connecting the second touch electrodes 420 adjacent to each other are formed on the same layer as the first touch electrodes 410 and integrated with the first touch electrodes 410. In these embodiments, the first connection portions 412 connecting the first touch electrodes 410 adjacent to each other are formed on a different layer from the first touch electrodes 410.

The first and second touch electrodes 410 and 420 can have a predetermined transmittance or greater so that light from the thin film display layer 200 is transmitted therethrough. For example, the first and second touch electrodes 410 and 420 may be formed of a transparent conductive material, such as indium tin oxide (ITO) or indium zinc oxide (IZO), a thin metal layer such as a silver nanowire (AgNW), a metal mesh, or carbon nanotubes (CNT), but are not limited thereto. The materials of the first and second connection portions 412 and 422 are the same as the materials of the touch electrodes.

The first and second touch wires 411 and 421 may include a transparent conductive material such as that forming the first and second touch electrodes 410 and 420 or a low resistive material such as molybdenum (Mo), silver (Ag), titanium (Ti), copper (Cu), aluminum (Al), or molybdenum/aluminum/molybdenum (Mo/Al/Mo).

The first and second touch electrodes 410 and 420 that are adjacent to each other form a mutual sensing capacitor functioning as the touch sensor. The mutual sensing capacitor receives a sensing input signal through one of the first and second touch electrodes 410 and 420 and outputs a change in stored charge due to contact of the external object through the other touch electrode as the sensing output signal.

In other embodiments, the first touch electrodes 410 and the second touch electrodes 420 are separated from each other and are electrically connected to a touch sensor controller through each touch wire (not illustrated). In these embodiments, each touch electrode forms a self-sensing capacitor to function as the touch sensor. The self-sensing capacitor receives the sensing input signal to store a predetermined charge and outputs a sensing output signal that is different from the sensing input signal due to a change in the stored charge generated when the external object such as a finger makes contact with the window 900.

Now, the thin film display layer according to an exemplary embodiment will be described with reference to FIG. 11 to FIG. 13. As previously described, the thin film display layer 200 includes a plurality of pixels.

Figure 11:
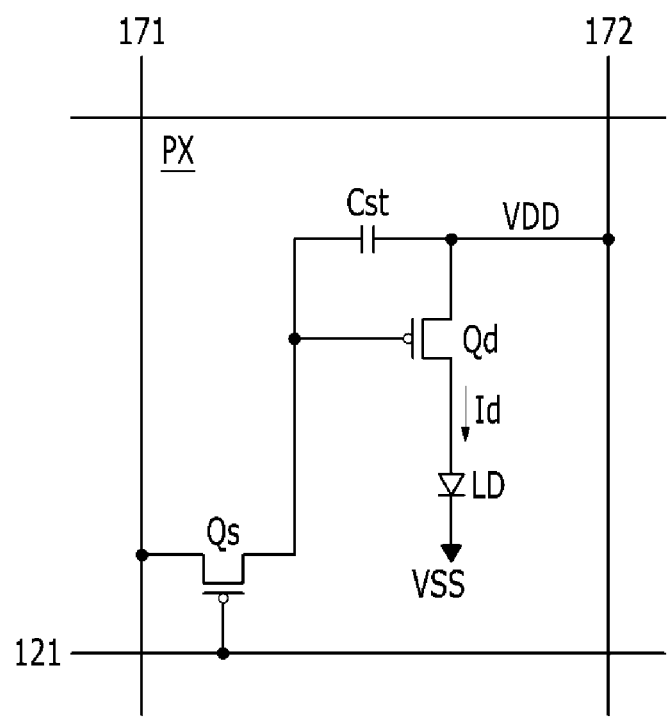
FIG. 11 is an equivalent circuit diagram of one pixel of the OLED display of FIG. 1.

FIG. 11 is an equivalent circuit diagram of one pixel of the OLED display of FIG. 1.

Referring to FIG. 11, the OLED display includes a plurality of signal lines 121, 171, and 172 and a plurality of pixels PX connected to the signal lines 121, 171, and 172 and substantially arranged in a matrix.

The signal lines include a plurality of gate lines 121 transmitting gate signals (or scan signals), a plurality of data lines 171 transmitting data signals, and a plurality of driving voltage lines 172 transmitting a driving voltage ELVDD. The display driver 500 respectively applies the gate and data signals to the gate and data lines 121 and 171.

The gate lines 121 extend in a row direction and are substantially parallel to each other and the data lines 171 and the driving voltage lines 172 extend in a column direction and are substantially parallel to each other.

Each pixel PX includes a switching thin film transistor Qs, a driving thin film transistor Qd, a storage capacitor Cst, and an OLED LD.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs transmits a data signal applied to the data line 171 to the driving thin film transistor Qd in response to a gate signal applied to the gate line 121.

The driving thin film transistor Qd includes a control terminal, an input terminal, and an output terminal. The control terminal is connected to the switching thin film transistor T1, the input terminal is connected to the driving voltage line 172, and the output terminal is connected to the OLED LD. The driving thin film transistor Qd outputs an output current Id with a magnitude that varies according to the voltage applied between the control terminal and the output terminal of the driving thin film transistor Qd.

The storage capacitor Cst is connected between the control terminal and the input terminal of the driving thin film transistor Qd. The storage capacitor Cst is charged with a data signal applied to the control terminal of the driving thin film transistor Qd and maintains the data signal after the switching thin film transistor Qs is turned off.

The OLED LD includes an anode connected to the output terminal of the driving thin film transistor Qd and a cathode connected to a common voltage VSS. The OLED LD emits light with an intensity that varies according to the output current Id of the driving this film transistor Qd to display an image.

The switching thin film transistor Qs and the driving thin film transistor Qd may be n-channel electric field effect transistors (FETs) or p-channel electric field effect transistors. In addition, the connection relationship of the switching and driving thin film transistors Qs and Qd, the storage capacitor Cst, and the OLED LD can be changed.

Figure 12:
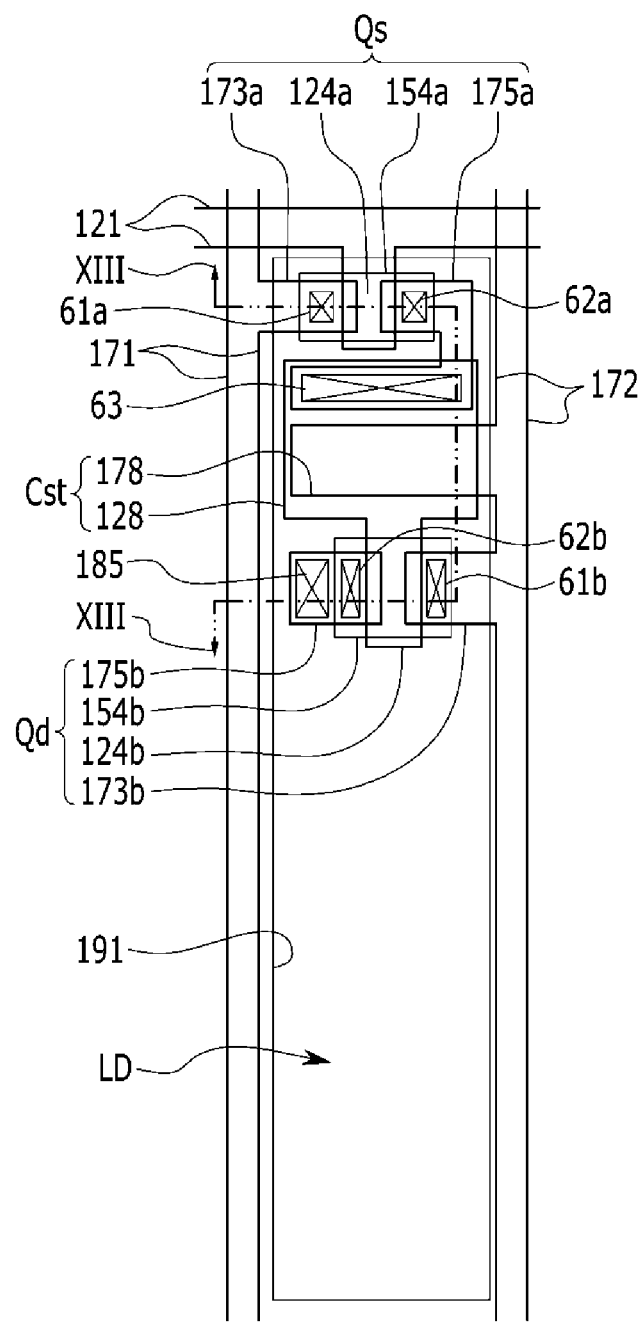
FIG. 12 is a layout view of one pixel of the OLED display of FIG. 1.

FIG. 12 is a layout view of one pixel of the OLED display of FIG. 1. FIG. 13 is a cross-sectional view of FIG. 12, taken along the line XIII-XIII.

Figure 13:
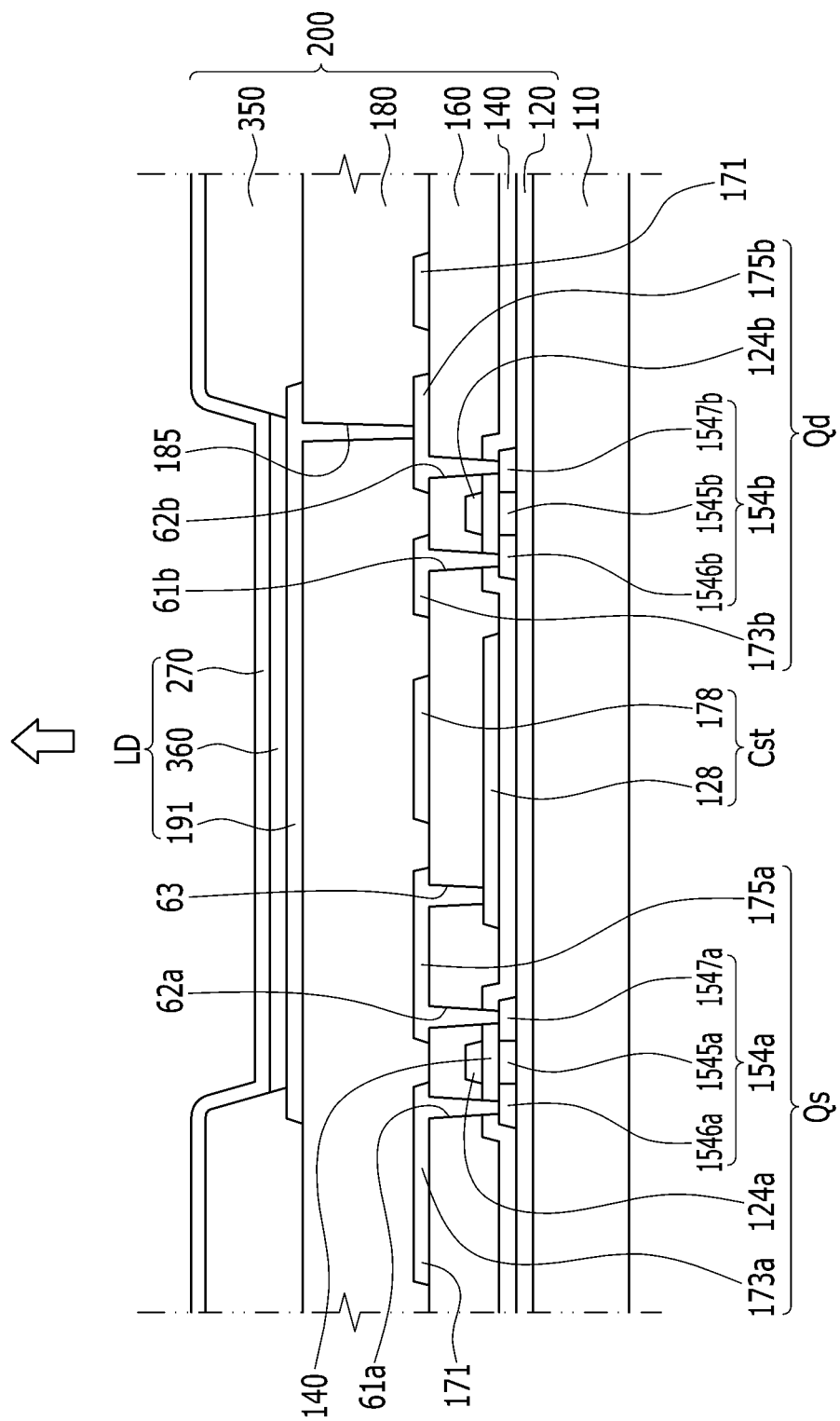
FIG. 13 is a cross-sectional view of FIG. 12, taken along the line XIII-XIII.

Referring to FIG. 12 and FIG. 13, the thin film display layer 200 is formed on the display substrate 110 in the OLED display.

The thin film display layer 200 includes a buffer layer 120, a switching semiconductor 154a, a driving semiconductor layer 154b, a gate insulating layer 140, gate lines 121, a first storage capacitor plate 128, an interlayer insulating layer 160, data lines 171, driving voltage lines 172, a switching drain electrode 175a, a driving drain electrode 175b, and a passivation layer 180.

The buffer layer 120 is formed on the display substrate 110 and can be formed as a single layer of a silicon nitride (SiNx) or as a dual-layer structure in which a silicon nitride (SiNx) and a silicon oxide (SiOx) are laminated. The buffer layer 120 serves to planarize the surface of the display substrate 110 while preventing unnecessary contaminants such as impurities or moisture from permeating therethrough.

The switching semiconductor layer 154a and the driving semiconductor layer 154b are formed at a distance from each other on the buffer layer 120. The switching semiconductor layer 154a and the driving semiconductor layer 154b are formed of polysilicon and include channel regions 1545a and 1545b, source regions 1546a and 1546b, and drain regions 1547a and 1547b. The source regions 1546a and 1546b and the drain regions 1547a and 1547b are respectively formed on opposing sides of the channel regions 1545a and 1545b.

The channel regions 1545a and 1545b are formed of polysilicon which is not doped with impurities, that is, intrinsic semiconductors, and the source regions 1546a and 1546b and the drain regions 1547a and 1547b are formed of polysilicon which is doped with impurities, that is, doped semiconductors.

The gate insulating layer 140 is formed on the channel regions 1545a and 1545b of the switching and driving semiconductor layers 154a and 154b. The gate insulating layer 140 may be a single layer or a multilayer including at least one of a silicon nitride and a silicon oxide.

The gate lines 121 and the first storage capacitor plate 128 are formed on the gate insulating layer 140.

The gate line 121 extends in a substantially horizontal direction and transmit a gate signal. The gate line 121 includes a switching gate electrode 124a protruding toward the switching semiconductor layer 154a from the gate line 121.

The first storage capacitor plate 128 includes a driving gate electrode 124b protruding toward the driving semiconductor layer 154b from the first storage capacitor plate 128. The switching gate electrode 124a and the driving gate electrode 124b respectively overlap the channel regions 1545a and 1545b.

The interlayer insulating layer 160 is formed on the gate line 121, the first storage capacitor plate 128, and the gate insulating layer 140.

A switching source contact hole 61a and a switching drain contact hole 62a that respectively expose the source region 1546a and the drain area 1547a of the switching semiconductor layer 154a are formed in the interlayer insulating layer 160. In addition, a driving source contact hole 61b and a driving drain contact hole 62b that respectively expose the source region 1546b and the drain region 1547b of the driving semiconductor layer 154b are formed in the interlayer insulating layer 160.

The data lines 171, the driving voltage lines 172, the switching drain electrode 175a, and the driving drain electrode 175b are formed on the interlayer insulating layer 160.

The data line 171 transmits a data signal and extends in a direction crossing the gate lines 121. The data line 171 includes a switching source electrode 173a protruding toward the semiconductor 154a from the data line 171.

The driving voltage line 172 transmits a driving voltage, is separated from the data line 171, and extends in substantially the same direction as the data line 171. The driving voltage line 172 includes a driving source electrode 173b protruding toward the driving semiconductor layer 154b from the driving voltage line 172 and a second storage capacitor plate 178 protruding from the driving voltage line 172 and overlapping the first storage capacitor plate 128. Here, the first storage capacitor plate 128 and the second storage capacitor plate 178 form the storage capacitor Cst using the interlayer insulating layer 160 as a dielectric material.

The switching drain electrode 175a faces the switching source electrode 173a and the driving drain electrode 175b faces the driving source electrode 173b.

The switching source electrode 173a and the switching drain electrode 175a are respectively connected with the source region 1546a and the drain region 1547a of the switching semiconductor layer 154a through the switching source contact hole 61a and the switching drain contact hole 62a. In addition, the switching drain electrode 175a extends and is thus electrically connected to the first storage capacitor plate 128 and the driving gate electrode 124b through a first contact hole 63 formed in the interlayer insulating layer 160

The driving source electrode 173b and the driving drain electrode 175b are respectively connected to the source region 1546b and the drain region 1547b of the driving semiconductor layer 154b through the driving source contact hole 61b and the driving drain contact hole 62b.

The switching semiconductor layer 154a, the switching gate electrode 124a, the switching source electrode 173a, and the switching drain electrode 175a form the switching thin film transistor Qs. Similarly, the driving semiconductor layer 154b, the driving gate electrode 124b, the driving source electrode 173b, and the driving drain electrode 175b form the driving thin film transistor Qd.

The passivation layer 180 is formed on the data lines 171, the driving voltage lines 172, the switching drain electrode 175a, and the driving drain electrode 175b.

A second contact hole 185 exposing the driving drain electrode 175b is formed in the passivation layer 180.

The OLED LD and a pixel defining layer 350 are formed on the passivation layer 180.

The OLED LD includes a pixel electrode 191, an organic emission layer 360, and a common electrode 270.

The pixel electrode 191 is formed on the passivation layer 180 and is electrically connected to the driving drain electrode 175b of the driving thin film transistor Qd through the second contact hole 185 formed in the interlayer insulating layer 160. The pixel electrode 191 is the anode of the OLED LD.

The pixel electrode 191 may be formed of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 350 is formed on an edge portion of the pixel electrode 191 and on the passivation layer 180.

The pixel defining layer 350 includes an opening exposing the pixel electrode 191. The pixel defining layer 350 may be formed of a resin such as a polyacrylate or a polyimide.

The organic emission layer 360 is formed on the pixel electrode 191 in the opening of the pixel defining layer 350. The organic emission layer 360 is formed of multilayers including one or more of a light emitting layer, a hole injection layer (HIL), a hole transporting layer (HTL), an electron transporting layer (ETL), and an electron injection layer (EIL). When the organic emission layer 360 includes all the layers, the hole injection layer (HIL) is formed on a pixel electrode which is an anode, and the hole transporting layer (HTL), the light emitting layer, the electron transporting layer (ETL), and the electron injection layer (EIL) are sequentially laminated thereon.

The organic emission layer 360 may include a red, green, or blue organic emission layer respectively emitting red, green, or blue light. The red, green, and blue organic emission layers are respectively formed in red, green, and blue pixels, thereby implementing a color image.

Further, the organic emission layer 360 may implement the color image by laminating the red, green, and blue organic emission layers together in each of the red, green, and blue pixels and forming one of red, green, and blue color filters for each pixel. As another example, white organic emission layers emitting white light may be formed in each of the red, green, and blue pixels and one of red, green, and blue color filters may be formed for each pixel, thereby implementing the color image. When implementing the color image by using the white organic emission layer and the color filters, a deposition mask for depositing the red, green, and blue organic emission layers on the respective pixels, that is, the red, green, and blue pixels is not required.

The white organic emission layer described in another example may be formed by one organic emission layer or can include a configuration formed so as to emit white light by laminating a plurality of organic emission layers. For example, the white organic emission layer may include a configuration which may emit white light by combining at least one yellow organic emission layer and at least one blue organic emission layer, a configuration which may emit white light by combining at least one cyan organic emission layer and at least one red organic emission layer, a configuration which may emit white light by combining at least one magenta organic emission layer and at least one green organic emission layer, and the like.

The common electrode 270 is formed on the pixel defining layer 350 and the organic emission layer 360. The common electrode 270 may be formed of a transparent conductive material such as ITO, IZO, ZnO, or In2O3, or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 270 is the cathode of the OLED LD.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a display substrate having first and second surfaces opposing each other;
   a thin film display layer formed over the first surface of the display substrate;
   an encapsulation substrate formed over the thin film display layer;
   a touch sensing layer formed over the encapsulation substrate and configured to sense a touch input;
   a display flexible printed circuit board electrically connected to the thin film display layer and attached to at least the second surface of the display substrate;
   a touch flexible printed circuit board electrically connected to the touch sensing layer and attached to the second surface of the display substrate; and
   an impact absorbing layer formed over the second surface of the display substrate and attaching i) the display flexible printed circuit board and ii) the touch flexible printed circuit board to the second surface of the display substrate,
   wherein the impact absorbing layer comprises a metal layer electrically connected to the display flexible printed circuit board and the touch flexible printed circuit board.

2. The OLED display of claim 1, wherein the impact absorbing layer further comprises i) a first adhesive layer formed over the second surface of the display substrate and ii) a cushion layer configured to absorb external impacts.

3. The OLED display of claim 2, wherein the first adhesive layer is interposed between the display substrate and the metal layer and wherein the metal layer is interposed between the first adhesive layer and the cushion layer.

4. The OLED display of claim 3, wherein a first opening is formed in the impact absorbing layer and at least partially exposes the display flexible printed circuit board and the touch flexible printed circuit board.

5. The OLED display of claim 4, wherein the first opening is formed in the metal layer and the cushion layer.

6. The OLED display of claim 5, wherein a second opening is further formed in the impact absorbing layer and exposes the display flexible printed circuit board and the touch flexible printed circuit board.

7. The OLED display of claim 6, wherein the second opening is formed in the first adhesive layer.

8. The OLED display of claim 7, wherein the area of the first opening is less than the area of the second opening.

9. The OLED display of claim 8, wherein the impact absorbing layer further comprises an overlapped portion that at least partially overlaps the display flexible printed circuit board and the touch flexible printed circuit board.

10. The OLED display of claim 9, wherein the metal layer and the cushion layer are formed on the display flexible printed circuit board and the touch flexible printed circuit board in the overlapped portion.

11. The OLED display of claim 10, wherein the metal layer is electrically connected to the display flexible printed circuit board and the touch flexible printed circuit board in the overlapped portion.

12. The OLED display of claim 1, wherein the display flexible printed circuit board and the touch flexible printed circuit board are bent around an edge of the display substrate.

13. The OLED display of claim 12, wherein the display flexible printed circuit board and the touch flexible printed circuit board are electrically connected to each other.

14. The OLED display of claim 1, wherein the thin film display layer comprises a plurality of pixels and wherein each pixel comprises an OLED.

15. The OLED display of claim 14, further comprising:
a display driver formed on the first surface of the display substrate and configured to apply a driving signal to each pixel; and
a touch driver formed on the touch flexible printed circuit board and configured to receive a sense output signal from the touch sensing layer.

16. An organic light-emitting diode (OLED) display, comprising:
a display substrate including first and second surfaces opposing each other;
a display flexible printed circuit board attached to at least the second surface of the display substrate;
a touch flexible printed circuit board attached to the second surface of the display substrate and at least partially overlapping the display flexible printed circuit board, wherein each of the display flexible printed circuit board and the touch flexible printed circuit board surrounds at least three surfaces of the display substrate; and
an impact absorbing layer formed over i) the second surface of the display substrate and ii) at least a portion of the display flexible printed circuit board and the touch flexible printed circuit board,
wherein the impact absorbing layer comprises a metal layer electrically connected to the display flexible printed circuit board and the touch flexible printed circuit board.

17. The OLED display of claim 16, wherein each of the display flexible printed circuit board and the touch flexible printed circuit board comprises a grounding wire electrically connected to the metal layer.

18. The OLED display of claim 16, wherein the impact absorbing layer further comprises i) a first adhesive layer interposed between the metal layer and the second surface of the display substrate and ii) a cushion layer formed over the metal layer and configured to absorb external impacts.

19. The OLED display of claim 18, wherein a first opening is formed in the metal layer and cushion layer and wherein a second opening having a greater area than the first opening is formed in the first adhesive layer.

20. The OLED display of claim 19, further comprising a touch sensing layer configured to sense a touch input, wherein the display flexible printed circuit board is attached to the first surface of the display substrate, and wherein the touch flexible printed circuit board is attached to the touch sensing layer.

* * * * *